United States Patent
Wang et al.

(10) Patent No.: US 9,614,268 B2
(45) Date of Patent: Apr. 4, 2017

(54) ANTI-LIGHTNING COMBINED-STRIPLINE-CIRCUIT SYSTEM

(71) Applicant: Honeywell International Inc., Morristown, NJ (US)

(72) Inventors: Nan Wang, Shang Hai (CN); Chao Wang, Shanghai (CN); Orville Nyhus, Glendale, AZ (US)

(73) Assignee: Honeywell International Inc., Morris Plains, NJ (US)

( * ) Notice: Subject to any disclaimer, the term of this patent is extended or adjusted under 35 U.S.C. 154(b) by 152 days.

(21) Appl. No.: 14/155,906

(22) Filed: Jan. 15, 2014

(65) Prior Publication Data

US 2015/0200434 A1   Jul. 16, 2015

(51) Int. Cl.

| | |
|---|---|
| *H01P 5/02* | (2006.01) |
| *H02H 1/04* | (2006.01) |
| *H05K 3/36* | (2006.01) |
| *H01P 1/04* | (2006.01) |
| *H01P 3/08* | (2006.01) |
| *H01Q 1/50* | (2006.01) |
| *H01Q 21/00* | (2006.01) |
| *H05K 1/14* | (2006.01) |
| *H01Q 21/08* | (2006.01) |
| *H01P 1/30* | (2006.01) |

(52) U.S. Cl.
CPC ............. *H01P 5/028* (2013.01); *H01P 1/047* (2013.01); *H01P 3/085* (2013.01); *H01Q 1/50* (2013.01); *H01Q 21/0075* (2013.01); *H02H 1/04* (2013.01); *H05K 1/142* (2013.01); *H05K 3/36* (2013.01); *H01P 1/30* (2013.01); *H01Q 21/08* (2013.01); *H05K 2201/09181* (2013.01); *H05K 2201/09845* (2013.01); *Y10T 29/49126* (2015.01)

(58) Field of Classification Search
CPC .......... H01P 3/082; H01P 3/088; H01P 1/047; H01P 5/022; H01P 5/028; H01Q 1/022
USPC ....................................... 333/260
See application file for complete search history.

(56) References Cited

U.S. PATENT DOCUMENTS

| | | |
|---|---|---|
| 5,471,181 A | 11/1995 | Park |
| 5,808,529 A | 9/1998 | Hamre |
| 5,929,822 A | 7/1999 | Kumpfbeck et al. |
| (Continued) | | |

FOREIGN PATENT DOCUMENTS

| | | |
|---|---|---|
| GB | 2171257 | 8/1986 |
| WO | 9523441 | 8/1995 |

OTHER PUBLICATIONS

Wang et al., "Integrated Stripline Feed Network for Linear Antenna Array", U.S. Appl. No. 13/879,300, filed Apr. 12, 2013, pp. 118, Published in: US.

(Continued)

*Primary Examiner* — Benny Lee
(74) *Attorney, Agent, or Firm* — Fogg & Powers LLC

(57) ABSTRACT

An anti-lightning-combined-stripline-circuit system is provided. The anti-lightning-combined-stripline-circuit system includes a stripline board including circuitry, and a metal ground bar attached to the stripline board. The metal ground bar has a geometry configured to function as a ground for the circuitry and simultaneously function as a lightning ground for a linear array of elements driven by the circuitry.

20 Claims, 12 Drawing Sheets

(56) References Cited

U.S. PATENT DOCUMENTS

| | | | |
|---|---|---|---|
| 6,362,787 B1* | 3/2002 | Judd | H01Q 1/002 343/700 MS |
| 8,154,466 B2 | 4/2012 | Lewis et al. | |
| 2005/0168301 A1 | 8/2005 | Carson | |
| 2008/0110020 A1 | 5/2008 | Heisen et al. | |
| 2013/0169504 A1 | 7/2013 | Jenwatanavet | |
| 2013/0256849 A1 | 10/2013 | Danny et al. | |

OTHER PUBLICATIONS

European Patent Office, "Extended European Search Report from EP Application No. 15150480.0 mailed Jun. 26, 2015", from Foreign Counterpart of U.S. Appl. No. 14/155,906, filed Jun. 26, 2015, pp. 1-10, Published in: EP.

European Patent Office, "Office Action from EP Application No. 15150480.0 mailed Mar. 14, 2016", from Foreign Counterpart of U.S. Appl. No. 14/155,906, filed Mar. 14, 2016, pp. 1-5, Published in: EP.

\* cited by examiner

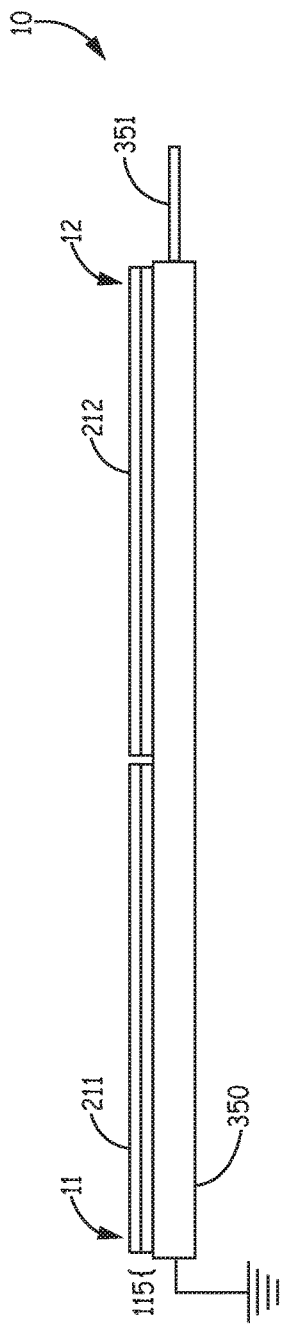
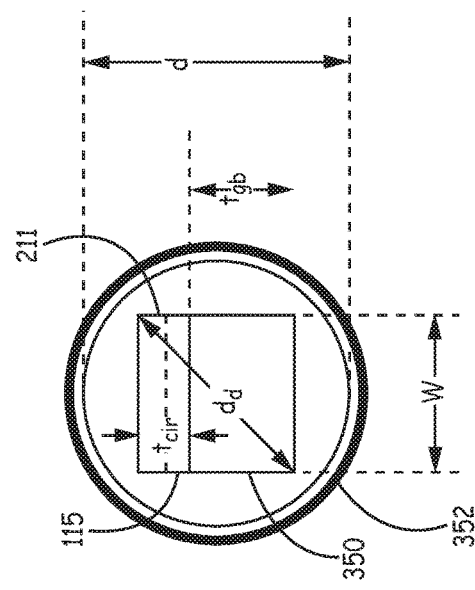

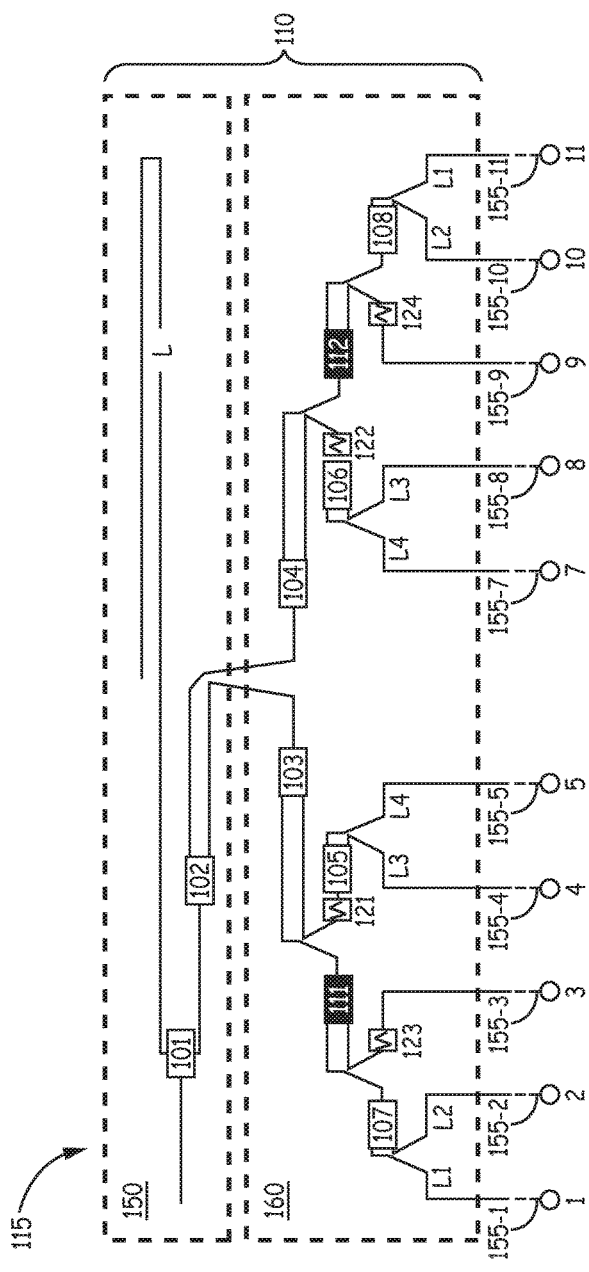
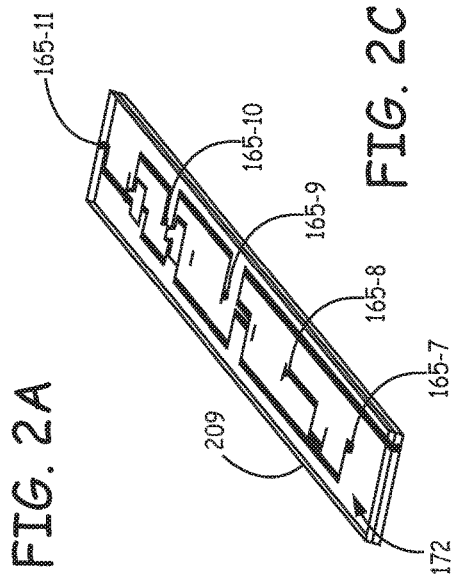
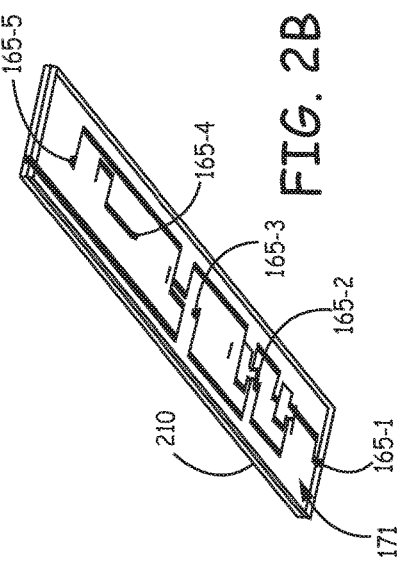

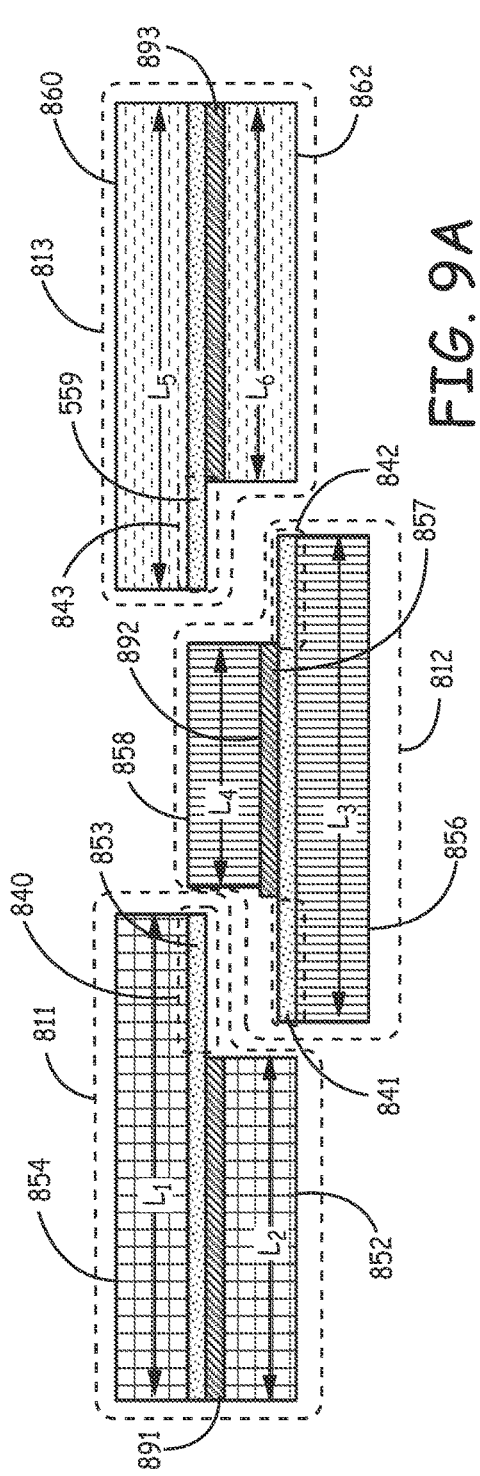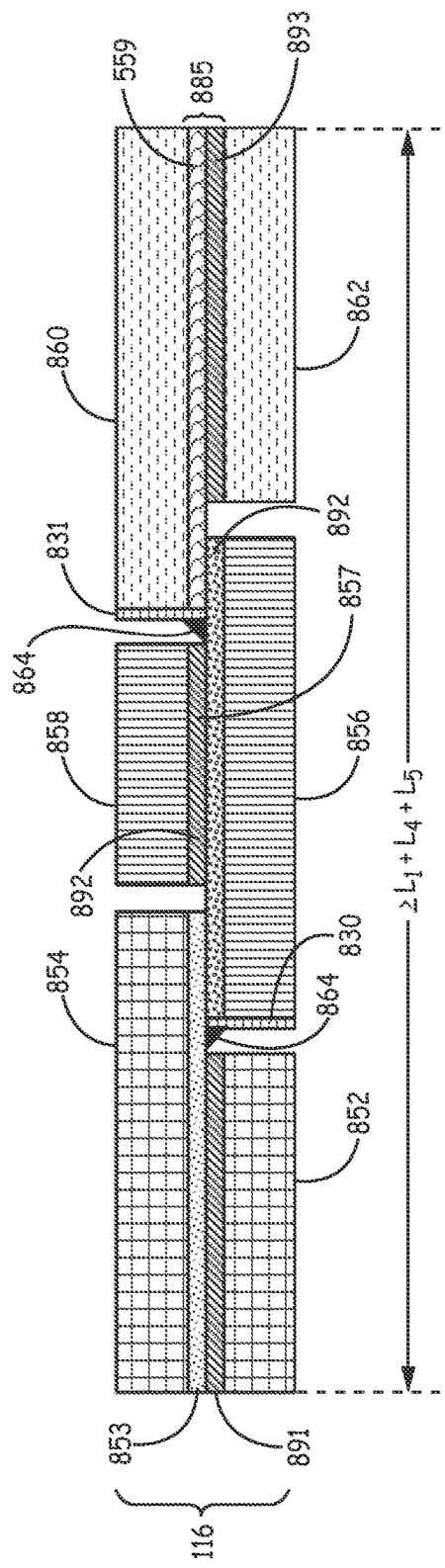

ANTI-LIGHTNING COMBINED-STRIPLINE-CIRCUIT SYSTEM

BACKGROUND

Electrical circuits that are positioned in outdoor environments need to be protected from lighting. For example, an antenna driving system is often exposed to lighting strikes that can destroy the circuits in the antenna driving system. A currently available solution requires installing an additional lightning rod close to the antenna or integrating a lightning protection rod into the antenna.

For some specific linear antenna array systems, the driving circuit is deployed inside a center pipe to be isolated from radiators that are outside and close to the center pipe. Both the lightning wire and the driving circuits are arranged into the space inside the center pipe with a good ground connection.

The driving circuits in some currently available linear antenna array systems are deployed inside a center pipe along with a plurality of bulky radio frequency (RF) cables used for the driving network. The center pipe isolates the antenna and cables from radiators that are outside the center pipe but close around outside the center pipe. In such prior art embodiments, the RF cables and the lightning wire are bundled together and the diameter of the center pipe must be large enough to include the bulky cables and the lightning ground wire.

SUMMARY OF THE INVENTION

The present application relates to an anti-lightning-combined-stripline-circuit system. The anti-lightning-combined-stripline-circuit system includes a stripline board including circuitry, and a metal ground bar attached to the stripline board. The metal ground bar has a geometry configured to function as a ground for the circuitry and simultaneously function as a lightning ground for a linear array of elements driven by the circuitry.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which:

FIG. 1A is a side view of an anti-lightning-combined-stripline-circuit system according to one embodiment;

FIG. 1B is an end view of the anti-lightning-combined-stripline-circuit system of FIG. 1A inside a center pipe;

FIG. 2A is a schematic diagram of a circuitry for a feed network according to one embodiment;

FIG. 2B is a diagram illustrating a first-portion of the circuitry of FIG. 2A in and/or on a first printed circuit board according to one embodiment;

FIG. 2C a second-portion of the circuitry of FIG. 2A in and/or on a second printed circuit board according to one embodiment;

FIG. 9A is a diagram illustrating a first-layered-stripline board, a second-layered-stripline board, and a third-layered-stripline board arranged with reference to each other prior to formation of a stripline board for an anti-lightning-combined-stripline-circuit system according to one embodiment;

FIG. 9B is a diagram illustrating a stripline board including the three layered-stripline boards of FIG. 9A for the anti-lightning-combined-stripline-circuit system;

Figure 3:
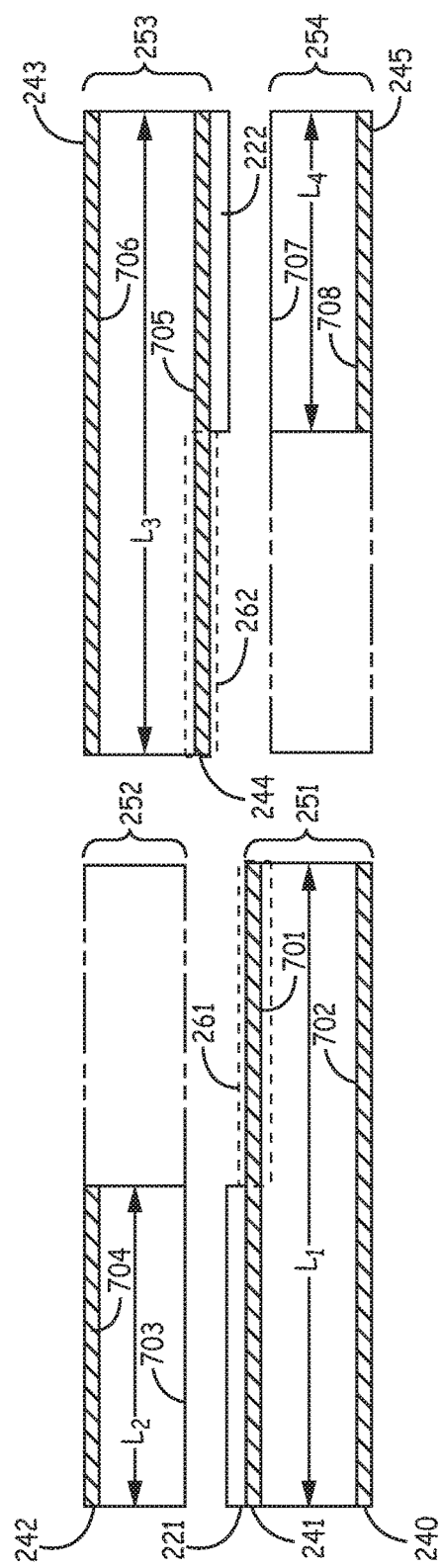
FIG. 3 is a diagram illustrating four substrates arranged with reference to each other prior to formation of a first-layered-stripline board and a second-layered-stripline board according to one embodiment.

In accordance with common practice, the various described features are not drawn to scale but are drawn to emphasize specific features relevant to the exemplary embodiments.

DETAILED DESCRIPTION OF THE INVENTION

In the following detailed description, reference is made to the accompanying drawings that form a part hereof, where like features in the different drawings are designated by the same reference label and may not be described in detail in every drawing in which they appear, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The present application overcomes the above referenced problems with protecting the circuitry associated with a linear array of elements that is integrated within a support structure by assembling the driving PC board onto a metal ground bar that has a cross-section that is sufficient to carry the current generated by a lightning strike. In one implementation of this embodiment, the circuitry associated with the linear array of elements includes driving circuits and power distribution circuits for the linear array of elements. Advantageously, the appropriately sized metal ground bar simultaneously functions as a ground for the electro-magnetic fields generated by the circuit and as a lightning ground. In one implementation of this embodiment, the present application overcomes the above referenced problems with protecting the circuitry associated with a linear antenna array that is integrated within an antenna support structure by assembling the driving PC board onto a metal ground bar that has a cross-section that is sufficient for carrying current due to a lightning strike and for grounding the electro-magnetic fields generated by the driving circuits for the linear antenna array.

FIG. 1A is a side view of an anti-lightning-combined-stripline-circuit system 10 according to one embodiment. FIG. 1B is an end view of the anti-lightning-combined-stripline-circuit system 10 of FIG. 1A inside a center pipe 352. The end view of FIG. 1B is viewed from a first end 11 of the anti-lightning-combined-stripline-circuit system 10 shown in FIG. 1A.

As shown in FIG. 1B, the anti-lightning-combined-stripline-circuit system 10 is designed to fit within the center pipe 350 that has a diameter d. In one implementation of this embodiment, the center pipe 352 is inside a support body for a linear array of elements. The anti-lightning-combined-stripline-circuit system 10 shown in FIG. 1A includes a stripline board 115, including a first-layered-stripline board 211 and a second-layered-stripline board 212, that is conductively attached to a metal ground bar 350. A lightning rod 351 is attached to a second end 12 of the metal ground bar 350 as shown in FIG. 1A. The metal ground bar 350 is grounded at the first end 11. The metal ground bar 350 is conductively attached to the stripline board 115. A first-layered-stripline board 211 and a second-layered-stripline board 211 are conductively attached to each other to form a multilayer stripline board 115. The stripline board 115 is conductively attached to the metal ground bar 350.

The circuitry, which is described below with reference to FIGS. 2A-2C and which is not visible in FIGS. 2A and 2B on the stripline board 115 requires protection from lighting strikes. The circuitry on the stripline board 115 also generates electro-magnetic fields. The metal ground bar 350 has a geometry configured to function as a ground for the electro-magnetic fields generated by the circuitry and to simultaneously function as a lightning ground for the circuitry. As shown in FIG. 1B, the metal ground bar 350 has a thickness $t_{gb}$ and a width W. These dimensions $t_{gb}$ and W are selected to ensure sufficient cross section to carry the current generated by a lighting strike and to ensure the electro-magnetic fields generated by the circuitry are simultaneously grounded by the metal ground bar 350. The thickness of the stripline board 115 is $t_{cir}$. As shown in FIG. 1B, the diagonal $d_d$ of the cross-section of the anti-lightning-combined-stripline-circuit system 10 is $\sqrt{W^2+(t_{gb}+t_{cir})^2}$. The inside diameter d of the center pipe 352 is slightly greater than the diagonal $d_d$ of the cross-section of the anti-lightning-combined-stripline-circuit system 10. Advantageously, diagonal $d_d$ of the cross-section of the anti-lightning-combined-stripline-circuit system 10 is less than the diameter of the prior art plurality of bundled RF cables and ground wire required to drive a linear antenna array as described above. Thus, the inside diameter d of the center pipe 352 for a given linear antenna array is less than the inside diameter of a prior art center pipe for the same linear antenna array.

In one implementation of this embodiment, the circuitry generates electro-magnetic fields in the radio frequency (RF) range and the metal ground bar 350 is designed to ground electro-magnetic fields at that RF range. In yet another implementation of this embodiment, the circuitry generates electro-magnetic fields in the microwave frequency range and the metal ground bar 350 is designed to ground electromagnetic fields at that microwave frequency range. In yet another implementation of this embodiment, the circuitry generates electro-magnetic fields in the millimeter frequency range and the metal ground bar 350 is designed to ground electro-magnetic fields at that millimeter frequency range.

In one implementation of this embodiment, the center 352 is inside a support body for a linear antenna array. In one implementation of this embodiment, circuitry 110 on the stripline board 115 includes a driving circuit 150 and a power distribution network 160 as shown in FIG. 2A and described below. In this case, the driving circuit 150 functions feed an antenna array through the power distribution network 160. In another implementation of this embodiment, the circuitry 110 can include circuitry for another type of linear array of components. In yet another implementation of this embodiment, the stripline board 115 includes other types of circuitry 110. In this manner, the driving circuit 100 is deployed inside the center pipe 352 in isolation from any radiators that are outside and close to the center pipe 352.

In one implementation of this embodiment, the center pipe 352 (FIGS. 1A and 1B) includes a non-conductive (e.g., plastic) top cover through which the lightning rod 351 protrudes. In another implementation of this embodiment, the center pipe 350 includes a non-conductive (e.g., plastic) radome through which the lightning rod 351 and a relatively small length of the metal bar 350 protrudes.

FIG. 2A is a schematic diagram of a circuitry 110 for a feed network according to one embodiment. As shown in FIG. 2A, the circuitry 110 includes a driving circuit 150 and a power distribution circuit 160. The circuitry 110 is also referred to herein as "feed network 110".

FIG. 2B is a diagram illustrating a first-portion 171 of the circuitry 110 of FIG. 2A in and/or on a first printed circuit board (PCB) 210 according to one embodiment. The PCB 210 includes multiple layers. The first-portion 171 includes a first-driving-circuit portion of the driving circuit 150 of FIG. 2A and a first-distribution-circuit portion of the power distribution circuit 160 of FIG. 2A.

FIG. 2C a second-portion 172 of the circuitry 110 of FIG. 2A in and/or on a second printed circuit board 209 according to one embodiment. The PCB 209 includes multiple layers. The second-portion 172 includes a second-driving-circuit portion of the driving circuit 150 of FIG. 2A and a second-distribution-circuit portion of the power distribution circuit 160 of FIG. 2A. It is to be understood that the first-driving-circuit portion of the driving circuit 150 and the second-driving-circuit portion of the driving circuit 150 together form the complete driving circuit 150. Likewise, the first-distribution-circuit portion of the power distribution circuit 160 and the second-distribution-circuit portion of the power distribution circuit 160 together form the power distribution circuit 160 of FIG. 2A. In one implementation of this embodiment, the power distribution circuit 160 is on one layer of the stripline board 115 and driving circuit 150 is on one layer of the stripline board 115.

As shown in FIG. 2B, the first-portion 171 includes about half of the driving circuit 150 of FIG. 2A and about half of the power distribution circuit 160 of FIG. 2A. Likewise, as shown in FIG. 2C, the second-portion 172 includes about half of the driving circuit 150 of FIG. 2A and about half of the power distribution circuit 160 of FIG. 2A. However, it is to be understood, that the first-portion 171 can include more or less than half of the driving circuit 150 and the power distribution circuit 160 of FIG. 2A. If the first-portion 171 includes less than half of the driving circuit 150 and the power distribution circuit 160 then the second portion 172 includes more than half of the driving circuit 150 and the power distribution circuit 160. For example, if the first-portion 171 includes about 25% of the driving circuit 150 and 25% of the power distribution circuit 160, the second-portion 172 includes about 75% of the driving circuit 150 and 75% of the power distribution circuit 160.

The embodiment of the circuitry 110 of FIG. 2A as described herein are described with reference to an apparatus for feeding a linear antenna array with an integrated stripline feed network that is described in the patent application Ser. No. 13/879,300 entitled INTEGRATED STRIPLINE FEED NETWORK FOR LINEAR ANTENNA ARRAY, which was filed in the nation stage from a PCT application on Apr. 12, 2013. The patent application having patent application Ser. No. 13/879,300 is referred to herein as the '300 Application and is incorporated herein in its entirety. A brief description of FIG. 2A is provided herein. However it is to be understood that the circuitry 110 can include other types of feed networks.

As shown in FIG. 2A, the feed input/output component 150 includes two 2-way power dividers 101 and 102 to create three output channels. Power dividers are used for power distribution that is balanced or only slightly unbalanced (e.g. 0 dB to −10 dB for the weaker channel).

Power divider 101 splits an input signal into two output channels. One output from power divider 101 is coupled to the second power divider 102 and the other output is coupled directly to an antenna element via a line having a length L that is pre-selected so that a feed phase that is consistent with the other feed channels is maintained. Power divider 102 further divides the output received from the power divider 101 into two more signal channels, one for a first portion of the power distribution network, and one for a second portion of the power distribution network. The output channel for the first portion of the power distribution network is coupled to a power divider 103. The two outputs from power divider 103 are coupled to a directional coupler 111 and phase delay unit 121. The output channel for the second portion of the power distribution network is coupled to a power divider 104. The two outputs from power divider 104 are coupled to a directional coupler 112 and a phase delay unit 122. The lines 155-1, 155-2, 155-3, 155-5, and 155-5 and lines 155-7, 155-8 , 155-9, 155-10, and 155-11 in FIG. 2A that terminate at ports represented generally as circles 1-5 and 7-11. The ports 1, 2, 3, 4, and 5 correlate to respective circuit points 165-1, 165-2, 165-3, 165-4, and 165-5 in FIG. 2B. The ports 7, 8, 9, 10, and 11 correlate to respective circuit points 165-7 165-8, 165-9, 165-10, and 165-11 in FIG. 1C. The functions of the power dividers 104, 105, 106, 107, and 108, the phase delay unit 124, the length of lines L1, L2, L3, and L4, and output channels 155-1, 155-2, 155-3, 155-4, 155-5, 155-7, 155-8, 155-9, 155-10, and 155-11 are described in detail in paragraphs [0013] through [0024] of the '300 Application and are not repeated herein.

The second PCB 209 of FIG. 2C is reserved to place the circuits for feeding ports from 7 to 11. The first PCB 210 of FIG. 2B is reserved to place the circuits for feeding ports from 1 to 5 and a sixth channel that is shown and described in the '300 Application. The first PCB 210 of FIG. 2B and the second PCB 209 of FIG. 2C are assembled onto a single metal ground bar 350 of FIG. 1B. In one implementation of this embodiment, the first PCB 210 and the second PCB 209 are soldered to metal ground bar 350. The RF connectors are soldered or screwed onto the first PCB 210 and the second PCB 209 to feed the circuit points 165(1-5) and circuit points 165(7-11). The metal bar 100 is about the length of the stripline board 200. The stripline board 115 includes one or two independent layer for distributed power dividers (e.g., 101 and 102) and delay lines (e.g., phase delay unit 121 and phase delay unit 123).

The embodiments of the anti-lightning-combined-stripline-circuit systems described herein are based on the topology depicted in the '300 Application, however this technology is applicable to a variety of other types of circuits. The technology described herein presents a design for the long length linear antenna array driven by a stripline with multiple layers. The circuitry 110 consists of two or more separate multilayer boards (e.g., first printed circuit board (PCB) 210 and second printed circuit board (PCB) 209) that are electrically connected to each other. The maximum length of the assembled board is able to reach up to twice the maximum size of the PCB material. For example, if the maximum size of PCB material is 48 inches, the driving length can be up to 96 inches. In one implementation of this embodiment, if three or more layered-stripline boards are assembled (as described below with reference to FIGS. 9A and 9B), the maximum length of the assembled board is able to reach up to three times the maximum size of the PCB material. In this manner the circuitry 110 has a length that is an extended beyond the maximum length of a PCB.

Figure 4:
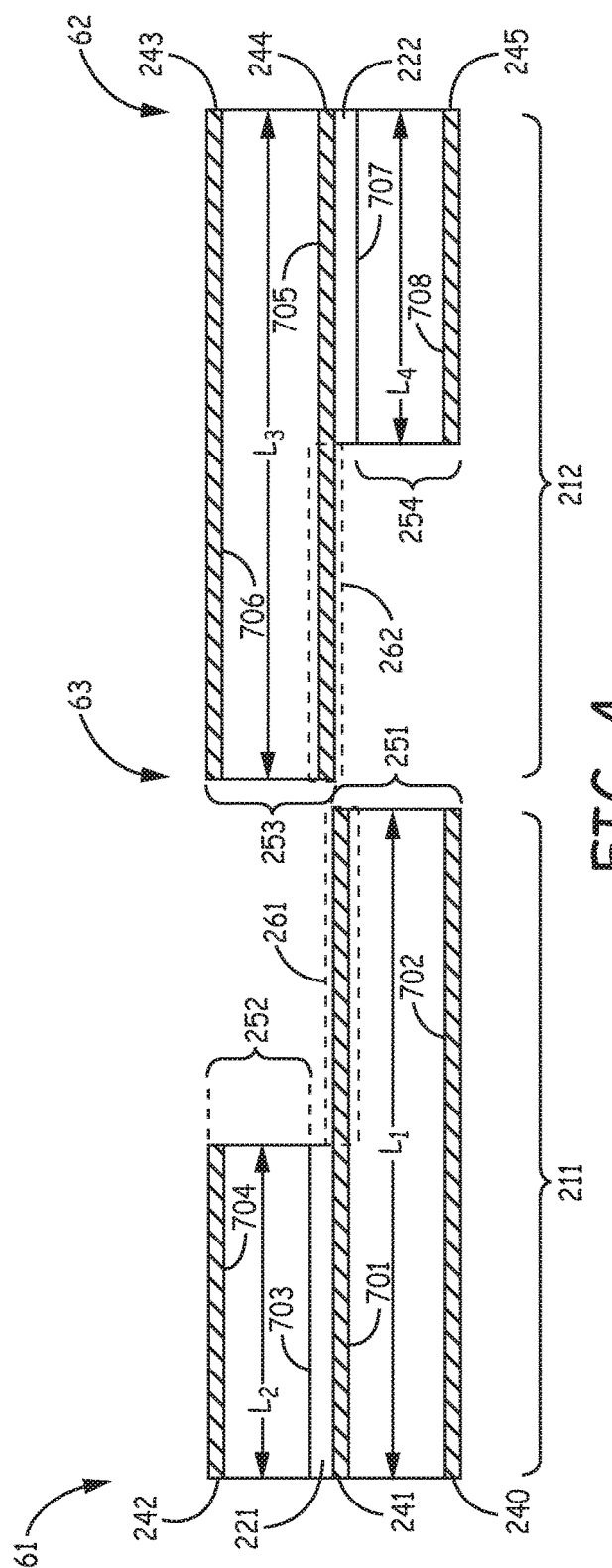
FIG. 4 is a diagram illustrating a first-layered-stripline board and a second-layered-stripline board arranged with reference to each other prior to formation of a stripline board for an anti-lightning-combined-stripline-circuit system according to one embodiment.
Figure 5:
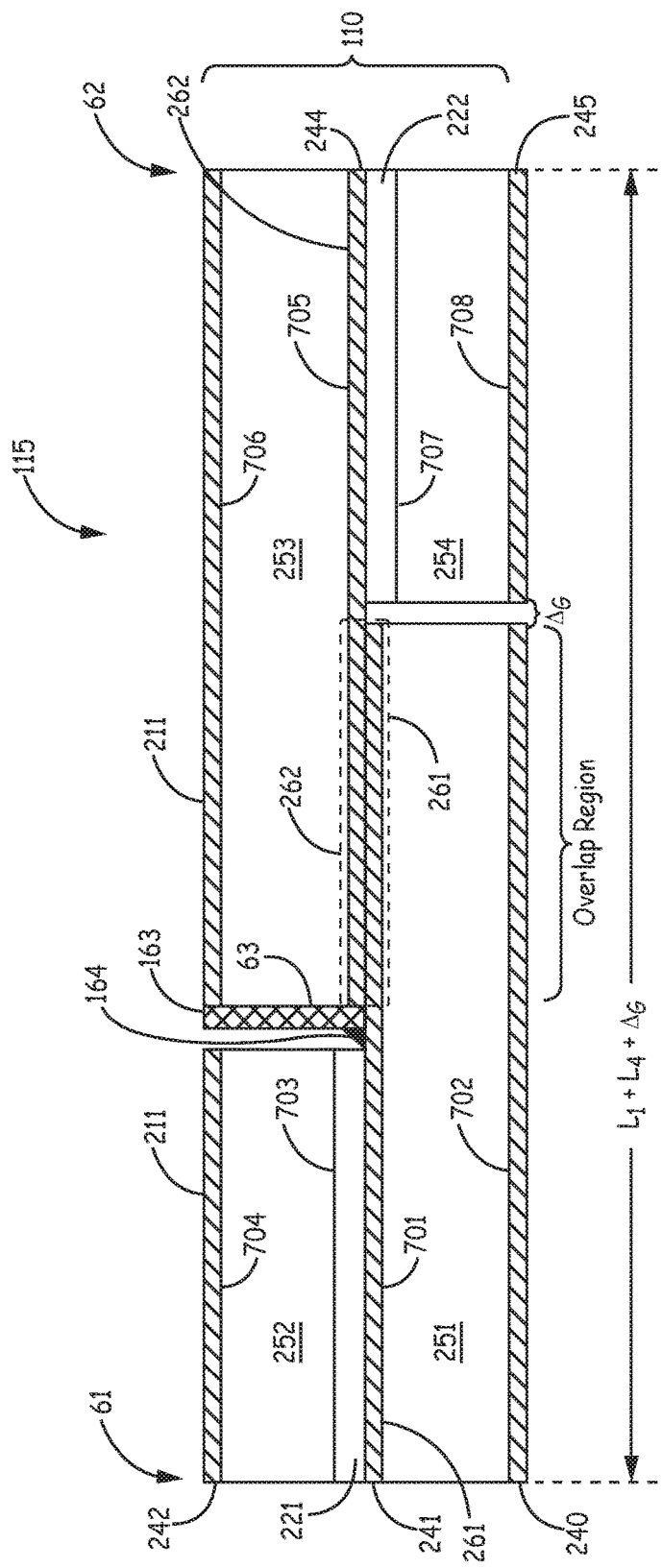
FIG. 5 is a diagram illustrating a stripline board for an anti-lightning-combined-stripline-circuit system according to one embodiment.

FIG. 3 is a diagram illustrating four substrates 251, 252, 253, and 254 arranged with reference to each other prior to formation of a first-layered-stripline board 211 and a second-layered-stripline board 212 according to one embodiment. FIG. 4 is a diagram illustrating a first-layered-stripline board 211 and a second-layered-stripline board 212 arranged with reference to each other prior to formation of a stripline board 115 for an anti-lightning-combined-stripline-circuit system 10 according to one embodiment. FIG. 5 is a diagram illustrating a stripline board 115 for an anti-lightning-combined-stripline-circuit system 10 according to one embodiment.

Figure 6A:
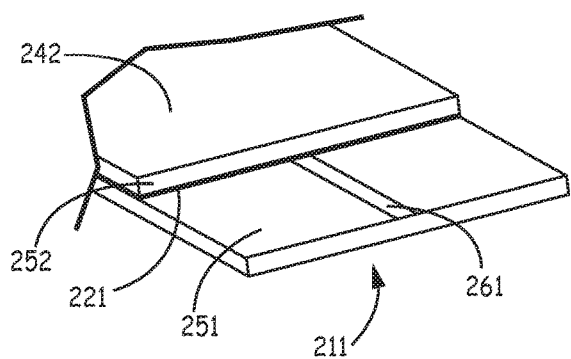
FIG. 6A shows a top perspective view of a portion of an exemplary first-layered-stripline board according to one embodiment.
Figure 6B:
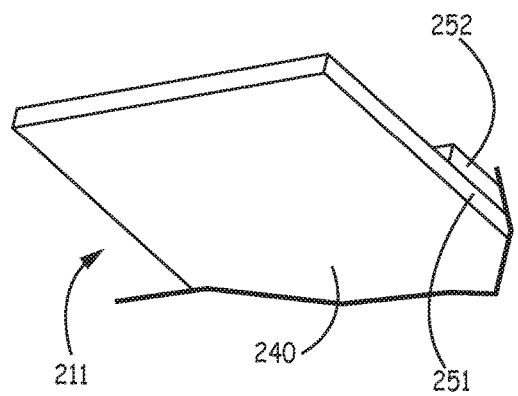
FIG. 6B shows a bottom perspective view of a portion of the exemplary first-layered-stripline board of FIG. 6A.
Figure 7A:
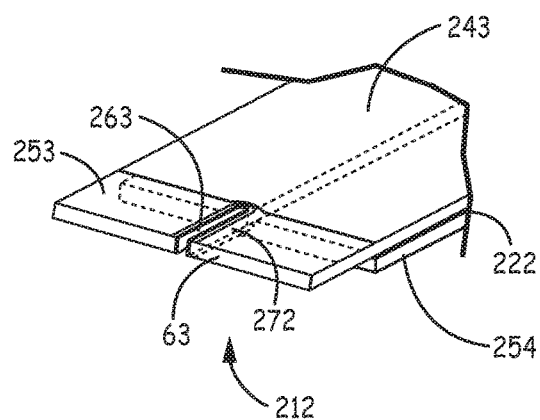
FIG. 7A shows a top perspective view of a portion of an exemplary second-layered-stripline board according to one embodiment.
Figure 7B:
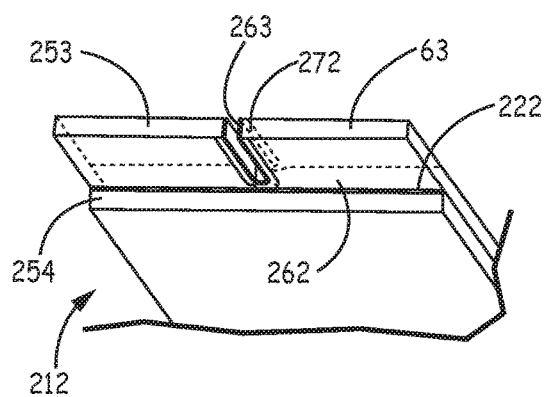
FIG. 7B shows a bottom perspective view of a portion of the exemplary second-layered-stripline board of FIG. 7A.
Figure 8A:
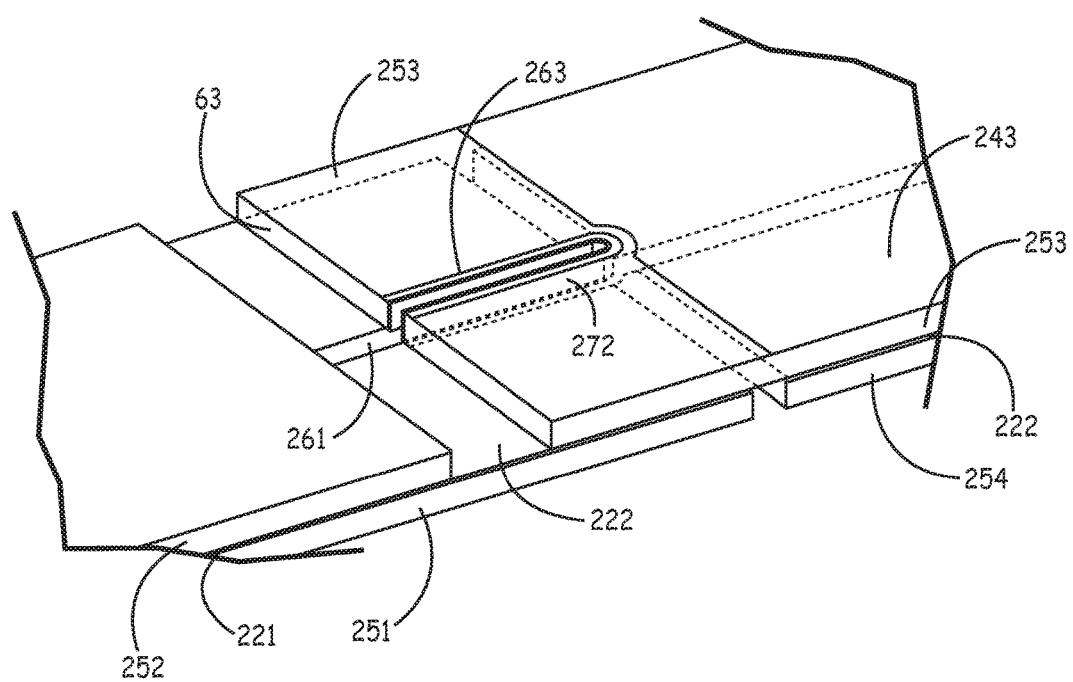
FIG. 8A shows a top perspective view of a soldering region of a stripline board for an anti-lightning-combined-stripline-circuit system according to one embodiment.
Figure 8B:
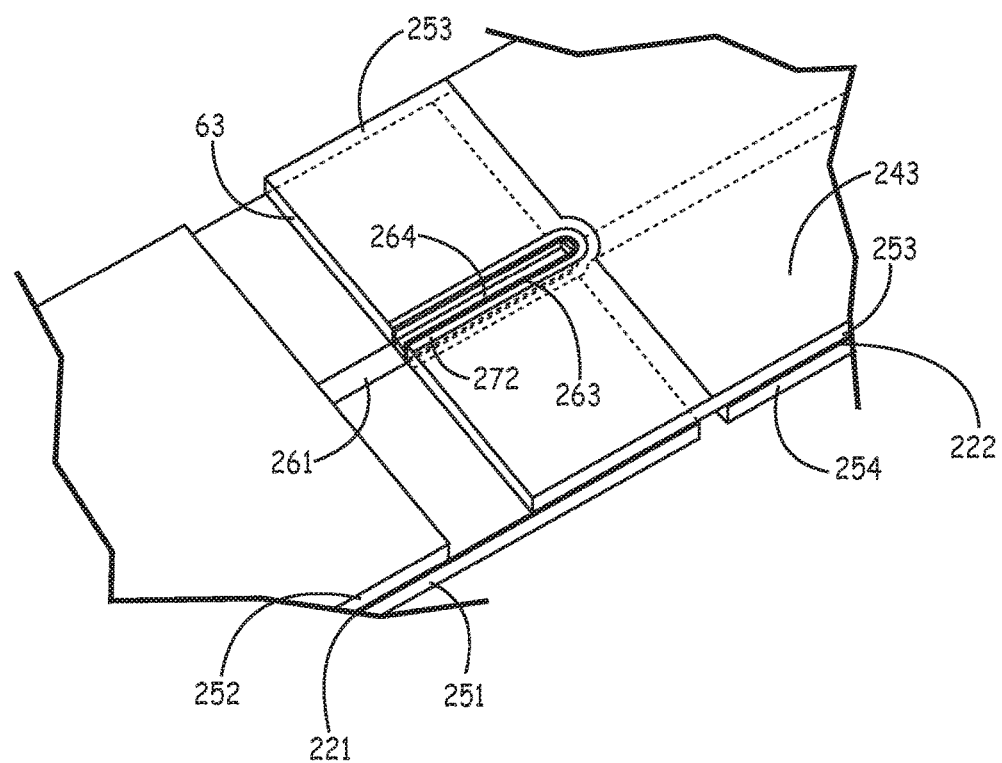
FIG. 8B shows a top perspective view of the soldering region of the stripline board of FIG. 8A filled with solder.

FIG. 6A shows a top perspective view of a portion of an exemplary first-layered-stripline board according to one embodiment. FIG. 6B shows a bottom perspective view of a portion of the exemplary first-layered-stripline board of FIG. 6A. FIGS. 6A and 6B show a first-layered-stripline board 211 formed based on the diagram of FIG. 4. FIG. 7A shows a top perspective view of a portion of an exemplary second-layered-stripline board according to one embodiment. FIG. 7B shows a bottom perspective view of a portion of the exemplary second-layered-stripline board of FIG. 7A. FIGS. 7A and 7B show a second-layered-stripline board 212 formed based on the diagram of FIG. 4. FIG. 8A shows a top perspective view of a soldering region 263 of a stripline board for an anti-lightning-combined-stripline-circuit system according to one embodiment. FIG. 8B shows a top perspective view of the soldering region 263 of the stripline board of FIG. 8A filled with solder 264. FIG. 8B shows an embodiment of the stripline board 115 for the anti-lightning-combined-stripline-circuit system 10 (Figure 1) formed based on the diagram of FIG. 5.

The stripline board 115 (FIG. 5) includes a first-layered-stripline board 211 (FIGS. 4, 6A, and 6B) and a second-layered-stripline board 212 (FIGS. 4, 5, 7A, and 7B). As shown in FIG. 5, the stripline board 115 has a length of $L_1 + L_4 + \Delta G$, where $\Delta G$ is a gap between a first substrate 251 and a fourth substrate 254. An overlap region between the first substrate 251 and a third substrate 253 is indicated.

As shown in FIGS. 3 and 4, the first-layered-stripline board 211 includes a first substrate 251 and a second substrate 252. The first substrate 251 has a first surface 701 that opposes a second surface 702. The first substrate 251 has a metal ground layer 240 (FIG. 6B) on the second surface 702. The first substrate 251 (FIGS. 6A and 6B) has a stripline layer 241 on the first surface 701 that includes a first-portion 171 (FIG. 2B) of the circuitry 110 of FIG. 2A to drive a linear array of elements, such as a linear antenna array. The second substrate 252 (FIGS. 6A and 6B) has a first surface 703 that opposes a second surface 704. The second substrate 252 has a metal ground layer 242 (FIG. 6A) on the second surface 704.

As shown in FIGS. 3 and 4, the second-layered-stripline board 212 includes a third substrate 253 and a fourth substrate 254 (FIG. 3). The third substrate 253 has a first surface 705 that opposes a second surface 706. The third substrate 253 has a metal ground layer 243 (FIG. 8B) on the second surface 706. The third substrate 253 has a stripline layer 244 on the first surface 705 that includes a second-portion 172 (FIG. 2C) of the circuitry 110 of FIG. 2A to drive a linear array of elements, such as a linear antenna array. The fourth substrate 254 has a first surface 707 that opposes a second surface 708. The fourth substrate 254 has a metal ground layer 245 on the second surface 708.

A first prepreg layer 221 is used to attach the stripline layer 241 of the first substrate 251 to the first layer 703 of the second substrate 252 of the first-layered-stripline board 211. A prepreg material is a composite material that includes a polymer impregnated with fibers. In one implementation of this embodiment, the prepreg layers, are formed from the same material as the substrates 251 and 252. The attachment is provided by melting the prepreg material in the first prepreg layer 221 until it adheres to the stripline layer 241 and the first layer 703 of the second substrate 252.

The first substrate 251 has a first length $L_1$ as shown in FIGS. 3 and 4. The second substrate 252 has a second length $L_2$ as shown in FIGS. 3 and 4. The first prepreg layer 221(FIGS. 6A, 8A, and 8B) has a length equal to the second length $L_2$. The second length $L_2$ is less than the first length $L_1$. When the stripline layer 241 of the first substrate 251 is attached to the first layer 703 of the second substrate 252, a first-circuit-portion represented generally at 261 (FIG. 6A) of the circuitry 110 on the first substrate 251 is exposed since the second length $L_2$ is less than the first length $L_1$. Another portion of the circuitry 110 that is positioned in or on the stripline layer 241 on the first substrate 251 is sandwiched between the first prepreg layer 221 and the first substrate 251.

In another implementation of this embodiment, the first substrate 251 and a second substrate 252 start out with the same length $L_1$(FIG. 4) and a portion of the second substrate 252 of the length ($L_1$-$L_2$) is milled out and attached to the first substrate 251 by melting the prepreg layer 221.

Similarly, a second prepreg layer 222 (FIGS. 7A, 7B, 8A, and 8B) is used to attach the stripline layer 244 on the first surface 705 of the third substrate 253 to the first surface 707 of the fourth substrate 254 of the second-layered-stripline board 212. The third substrate 253 has a third length $L_3$ as shown in FIG. 4. The second prepreg layer 222 has a length equal to the fourth length $L_4$ as shown in FIG. 4. The fourth length $L_4$ is less than the third length $L_3$. When the stripline layer 244 of the third substrate 253 is attached to the first layer 707 of the fourth substrate 254, a second-circuit-portion represented generally at 262 of the circuitry 110 on the third substrate 253 is exposed since the fourth length $L_4$ is less than the third length $L_3$. Another portion of the circuitry 110 that is positioned in or on the stripline layer 244 on the third substrate 253 is sandwiched between the second prepreg layer 222 and the third substrate 253.

As shown in FIG. 5, a soldering region 164 is formed by a metal-coated edge-surface 163 of an edge 63 of the third substrate 253. When solder is applied to the soldering region 164 (FIG. 5), the metal-coated edge-surface 163 and the first-circuit-portion 261 of the circuitry 110 on the first substrate 251, the stripline layer 241 of the first substrate 251 is electrically connected to the stripline layer 244 of the third substrate 253.

In the embodiment of FIGS. 7A, 7B, 8A, and 8B, the soldering region 263 is a metal-coated U-shaped edge surface 272 formed in the third edge 63 of the third substrate 253. As shown in FIG. 8B, the solder 264 fills the metal-coated U-shaped soldering region 263.

In one implementation of this embodiment, the first, second, third, and fourth substrates 251-254 are substrates suitable for a PCB.

As shown in FIG. 4, the first substrate 251 and the second substrate 252 are flush at a first end 61 of the first-layered-stripline board. Similarly, the third substrate 253 and the fourth substrate 254 are flush at a second end 62 of second-layered-stripline board 212. This is not a required feature. In the event that six substrates form three layered-stripline boards with two soldering regions to electrically connect the three layered-stripline boards, at least one of the layered-stripline boards will have exposed circuit-portions on both ends of a center layered-stripline board. Such an embodiment is shown in FIGS. 9A and 9B.

FIG. 9A is a diagram illustrating a first-layered-stripline board 811, a second-layered -stripline board 812, and a third-layered-stripline board 813 arranged with reference to each other prior to formation of a stripline board 116 for an anti-lightning-combined-stripline-circuit system 10 according to one embodiment. FIG. 9B is a diagram illustrating a stripline board 116 including the three multi-layered-stripline boards 811-813 of FIG. 9A for the anti-lightning-combined-stripline-circuit system 10

Returning to FIGS. 9A and 9B, the first-layered-stripline board 811 (FIG. 9A) includes a first substrate 854 and a second substrate 852. The first substrate 854 has a stripline layer 853 that includes a first-portion of the circuitry (e.g., circuitry 110 of FIG. 2A) to drive a linear array of elements (e.g., a linear antenna array). As described above, a first prepreg layer 891 is used to attach the stripline layer 853 positioned on the first substrate 854 to the second substrate 852 to form the first-layered-stripline board 811 (FIG. 9A). The first substrate 854 has a length of $L_1$ and the second substrate 852 has a length of $L_2$ as shown in FIG. 9A. The first prepreg layer 891 has a length equal to the second length $L_2$ as shown in FIG. 9A. The second length $L_2$ is less than the first length $L_1$.

When the stripline layer 853 of the first substrate 854 is attached to the first prepeg layer 891 of the second substrate 852, a first-circuit-portion represented generally at 840 (FIG. 9A) of the circuitry 110 on the first substrate 854 is exposed since the second length $L_2$ is less than the first length $L_1$. The exposed first-circuit-portion 840 has a length of $L_1$-$L_2$. Another portion of the circuitry 110 that is positioned in or on the stripline layer 853 on the first substrate 854 is sandwiched between the first prepreg 891 and the first substrate 854.

The second-layered-stripline board 812 includes a third substrate 856 and a fourth substrate 858. The third substrate 856 has a stripline layer 857 that includes a second-portion of the circuitry to drive a linear array of elements, such as a linear antenna array. A second prepreg layer 892 is used to attach the stripline layer 857 positioned on the third substrate 856 to the fourth substrate 858 to form the secondlayered-stripline board 812. The third substrate 856 has a length of $L_3$ and the fourth substrate 858 has a length of $L_4$ as shown in FIG. 9A. The fourth length $L_4$ is less than the third length $L_3$. A second-circuit-portion represented generally at 841 (FIG. 9A) of the circuitry on the third substrate 856 is exposed. Additionally, a third-circuit-portion represented generally at 842 (FIG. 9A) of the circuitry on the third substrate 856 is exposed. The combination of the exposed second-circuit-portion 841 and the exposed third-circuit-portion 842 has a length of $L_3$-$L_4$. In one implementation of this embodiment, the length of the exposed second-circuit-portion 841 equals the length of the exposed third-circuit-portion 842.

The third-layered-stripline board 813 (FIG. 9A) includes a fifth substrate 860 and a sixth substrate 862. The fifth substrate 860 has a stripline layer 559 that includes a third-portion of the circuitry to drive a linear array of elements, such as a linear antenna array. A third prepreg layer 893 is used to attach the stripline layer 559 positioned on the fifth substrate 860 to the sixth substrate 862 to form the third-layered-stripline board 813. The fifth substrate 860 has a length of $L_5$ and the sixth substrate has a length of $L_6$ as shown in FIG. 9A. The sixth length $L_6$ is less than the fifth length $L_5$. A fourth-circuit-portion represented generally at 843 (FIG. 9A) of the circuitry on the fifth substrate 860 is exposed. The exposed fourth-circuit-portion 843 has a length of $L_5$-$L_6$.

If the length of the exposed second-circuit-portion 841 approximately equals the length of the exposed third-circuit-portion 842, then the length of the exposed fourth-circuit-portion 843 on the third-layered-stripline board 813 approximately equals the length of the exposed first-circuit-portion 840 the first-layered-stripline board 811. This symmetry is not required. The third substrate 856 is shown in FIG. 9A as being approximately centered on the fourth substrate 858. However, the third substrate 856 can be positioned at another place on the fourth substrate 858 as long as there are two exposed circuit portions (e.g., second-circuit-portion 841 and third-circuit-portion 842) on the two respective ends of the third substrate 856.

As shown in FIG. 9B, the first-layered-stripline board 811, the second-layered-stripline board 812 and the third-layered-stripline board 813 are assembled to form an extended length circuitry 885 (FIG. 9B) with a length greater than or equal to $L_1+L_4+L_5$. For example, a metal-coated edge-surface 830 is formed on one edge of third substrate 856 and a metal-coated edge-surface 831 is formed on the fifth substrate 860. Then solder 864 (FIG. 9B) is applied at the metal-coated edge-surface and the metal-coated edge-surface 831 to electrically connect the first-layered-stripline board 811 to the second-layered-stripline board 812 and to the third-layered-stripline board 813. It is to be understood that other edge coating can be used to electrically connect the first-layered -stripline board 811 to the second-layered-stripline board 812 and to the third-layered -stripline board 813.

Figure 10:
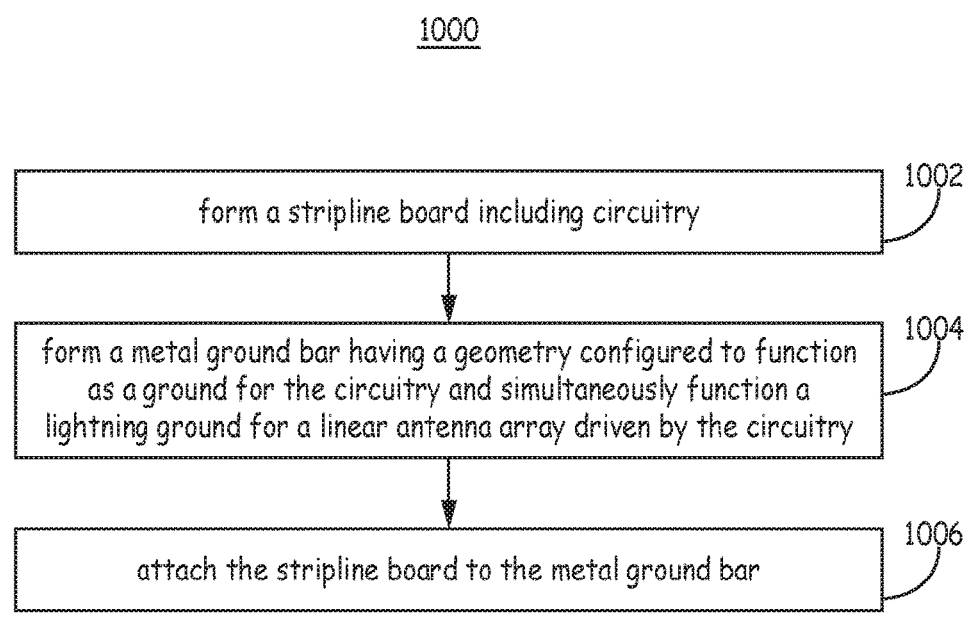
FIG. 10 is an exemplary flow chart illustrating an exemplary method of forming an anti-lightning-combined-stripline-circuit system.

FIG. 10 is an exemplary flow chart illustrating an exemplary method 1000 of forming an anti-lightning-combined-stripline-circuit system. The method 1100 is described with reference to FIGS. 1A, 1B, 2A, 2B, 2C, 3, 4, 5, 6A, 6B, 7A, 7B, 8A, and 8B.

At block 1002, a stripline board 115 including circuitry 110 is formed.

At block 1004, a metal ground bar 350 if formed that has a geometry configured to function as a ground for the circuitry 110 and simultaneously function as a lightning ground for a linear array of elements driven by the circuitry 110.

At block 1006, the stripline board 115 is attached to the metal ground bar 350. In one implementation of this embodiment, the stripline board 115 is epoxied to the metal ground bar 350. In another implementation of this embodiment, the stripline board 115 is soldered to the metal ground bar 350. In yet another implementation of this embodiment, the stripline board 115 is attached to the metal ground bar 350 with an adhesive. In yet another implementation of this embodiment, the stripline board 115 is screwed to the metal ground bar 350. In this case, the positions of the screws are arranged to avoid contact with the circuitry on the stripline board 115.

Figure 11:
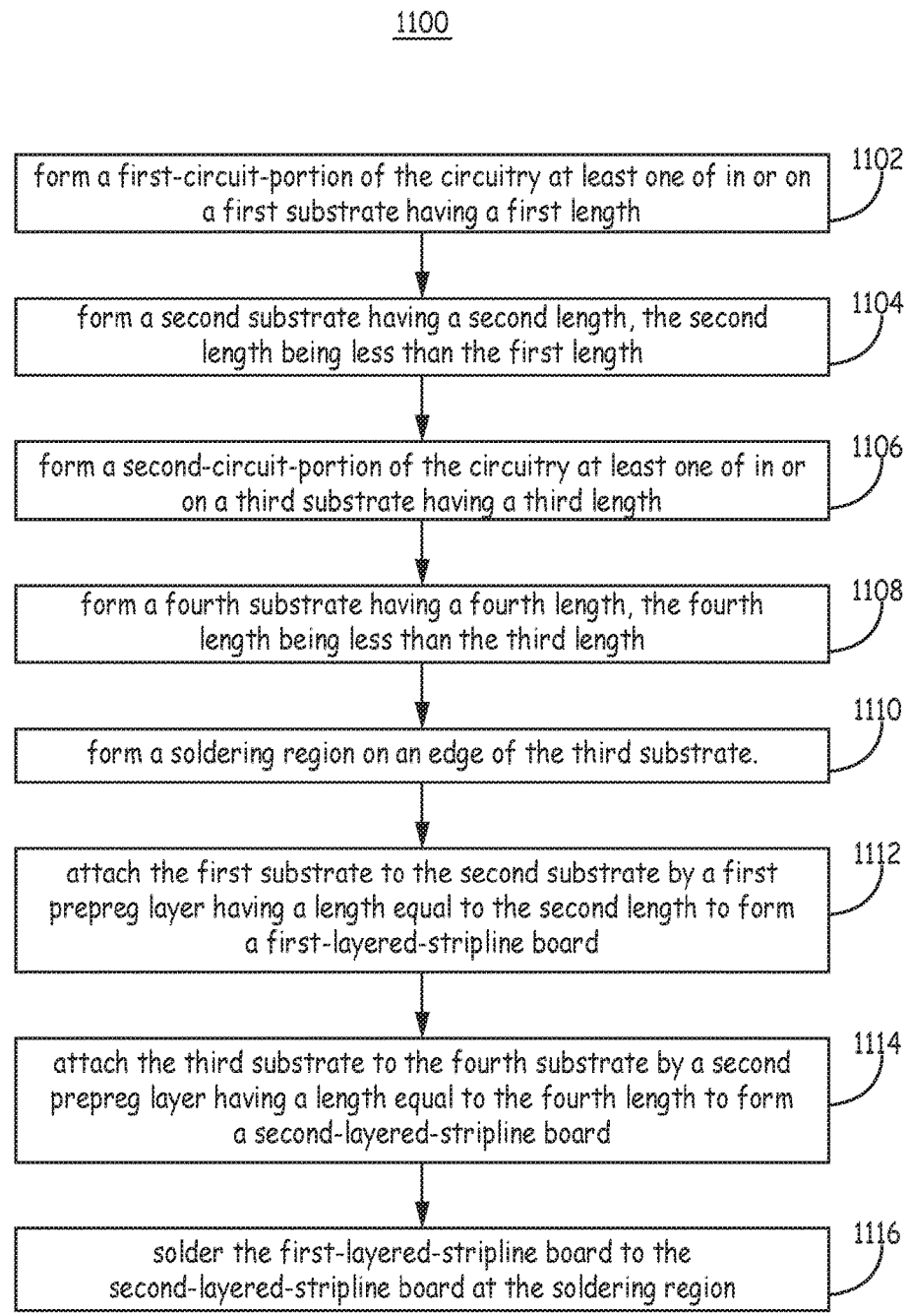
FIG. 11 is an exemplary flow chart illustrating an exemplary method of forming a stripline board.

FIG. 11 is an exemplary flow chart illustrating an exemplary method 1100 of forming a stripline board. The method 1100 is described with reference to FIGS. 2A, 2B, 2C, 3, 4, 5, 6A, 6B, 7A, 7B, 8A, and 8B.

At block 1102, a first-circuit-portion 261 of the circuitry 110 is formed in and/or on a first substrate 251 having a first length $L_1$. In one implementation of this embodiment, a first-driving-circuit portion and a first-distribution-circuit portion of the circuitry 110 are formed at least one of in or on a first substrate 251 having a first length $L_1$.

At block 1104, a second substrate 252 is formed with a second length $L_2$. The second length $L_2$ is less than the first length $L_1$.

At block 1106, a second-circuit-portion 262 of the circuitry 110 is formed in and/or on a third substrate 253 having a third length $L_3$. In one implementation of this embodiment, a second-driving-circuit portion and a second-distribution-circuit portion are formed at least one of in or on a third substrate 253 having a third length $L_3$.

At block 1108, a fourth substrate 254 is formed with a fourth length $L_4$, the fourth length $L_4$ being less than the third length $L_3$.

At block 1110, a soldering region is formed on an edge 63 of the third substrate 253. In one implementation of this embodiment, the edge 63 is coated with metal to form the soldering region 163 shown in FIG. 5. In another implementation of this embodiment, the edge 63 is notched and the notched region is coated with metal. For example, a U-shaped notch can be cut into the edge 63 and the edge 272 of the U-shaped notch is coated with metal to form the soldering region 263 shown in FIG. 8A.

At block 1112, the first substrate 251 is attached to the second substrate by a first prepreg layer 221 to form a first-layered-stripline board 211. The first prepreg layer 221 has a length equal to the second length $L_2$.

At block 1114, the third substrate 253 is attached the fourth substrate 254 by a second prepreg layer 222. The second prepreg layer 222 has a length equal to the fourth length $L_4$ to form a second-layered-stripline board 212.

At block 1116, the first-layered-stripline board 211 is soldered to the second-layered-stripline board 212 at the soldering region 263 to increase a circuitry-length of the circuitry 110. In one implementation of this embodiment, the first-layered-stripline board 211 is soldered to the second-layered-stripline board 212 at the soldering region 263 to increase a length of a driving circuit 150 and a power distribution circuit 160.

Example Embodiments

Example 1 includes an anti-lightning-combined-stripline-circuit system, comprising: a stripline board including circuitry; and a metal ground bar attached to the stripline board, the metal ground bar having a geometry configured to function as a ground for the circuitry and simultaneously function as a lightning ground for a linear array of elements driven by the circuitry.

Example 2 includes the anti-lightning-combined-stripline-circuit system of Example 1, wherein the stripline board comprises: a first-layered-stripline board comprising a first substrate having a first length and a second substrate having a second length, the second length being less than the first length, wherein a first-circuit-portion of the circuitry on the first substrate is exposed; and a second-layered-stripline board comprising a third substrate having a third length and a fourth substrate having a fourth length, the fourth length being less than the third length, wherein a second-circuit-portion of the circuitry on the third substrate is exposed, the anti-lightning-combined-stripline-circuit system further comprising: a soldering region formed by a metal-coated edge-surface of an edge of the third substrate.

Example 3 includes the anti-lightning-combined-stripline-circuit system of Example 2, further comprising: a first prepreg layer having a length equal to the second length, the first prepreg layer attaching the first substrate to the second substrate of the first-layered-stripline board; and a second prepreg layer having a length equal to the fourth length, the second prepreg layer attaching the third substrate to the fourth substrate of the second-layered-stripline board.

Example 4 includes the anti-lightning-combined-stripline-circuit system of any of Examples 2-3, wherein the first-circuit-portion is electrically connected to the second-circuit-portion by soldering the first-circuit-portion to the second-circuit-portion at the soldering region, wherein at least of a portion of the first-circuit-portion is covered by the third substrate and at least a portion of the second-circuit-portion is covered by the first substrate wherein a length of the circuitry on the stripline board is increased.

Example 5 includes the anti-lightning-combined-stripline-circuit system of any of Examples 2-4, wherein the soldering region is a metal-coated U-shaped edge surface.

Example 6 includes the anti-lightning-combined-stripline-circuit system of any of Examples 1-5, wherein the circuitry comprises: a driving circuit for the linear array of elements; and a power distribution circuit for the linear array of elements, wherein the stripline board comprises: a first-layered-stripline board including a first substrate having a first length and a second substrate having a second length, the second length being less than the first length, wherein at least a portion of a first-driving-circuit portion and a first-distribution-circuit portion on the first substrate is exposed; and a second-layered-stripline board including a third substrate having a third length and a fourth substrate having a fourth length, the fourth length being less than the third length, wherein at least a portion of a second-driving-circuit portion and a second-distribution-circuit portion on the third substrate is exposed.

Example 7 includes the anti-lightning-combined-stripline-circuit system of Example 6, further comprising: a soldering region formed from a metal-coated edge-surface of an edge of the third substrate, wherein the soldering region electrically connects the first-driving-circuit portion to the second-driving-circuit portion and the first-distribution-circuit portion to the second-distribution-circuit portion, wherein a length of the linear array of elements driven by the driving circuit is increased.

Example 8 includes the anti-lightning-combined-stripline-circuit system of any of Examples 1-7, wherein the circuitry comprises: a driving circuit for a linear antenna array; and a power distribution circuit for the linear antenna array, wherein the metal ground bar has a geometry configured to function as: a lightning ground for the linear antenna array; and one of function as one of a microwave frequency ground, a millimeter wave frequency ground, or a radio frequency ground for the driving circuit and the power distribution circuit.

Example 9 includes a method of forming an anti-lightning-combined-stripline-circuit system, the method comprising: forming a stripline board including circuitry; forming a metal ground bar having a geometry configured to function as a ground for the circuitry and simultaneously function as a lightning ground for a linear array of elements driven by the circuitry; and attaching the stripline board to the metal ground bar.

Example 10 includes the method of Example 9, wherein forming a stripline board including circuitry comprises: forming a first-circuit-portion of the circuitry at least one of in or on a first substrate having a first length; forming a second substrate having a second length, the second length being less than the first length; forming a second-circuit-portion of the circuitry at least one of in or on a third substrate having a third length; and forming a fourth substrate having a fourth length, the fourth length being less than the third length.

Example 11 includes the method of any of Examples 9-10, further comprising: forming a soldering region on an edge of the third substrate.

Example 12 includes the method of Example 11, further comprising: attaching the first substrate to the second substrate by a first prepreg layer having a length equal to the second length to form a first-layered-stripline board; and attaching the third substrate to the fourth substrate by a second prepreg layer having a length equal to the fourth length to form a second-layered-stripline board.

Example 13 includes the method of Example 12, further comprising soldering the first-layered-stripline board to the second-layered-stripline board at the soldering region to increase a circuitry-length of the circuitry.

Example 14 includes the method of any of Examples 9-13, wherein forming a stripline board including circuitry comprises: forming a first-driving-circuit portion and a first-distribution-circuit portion of the circuitry at least one of in or on a first substrate having a first length; forming a second substrate having a second length, the second length being less than the first length; forming a second-driving-circuit portion and a second-distribution-circuit portion at least one of in or on a third substrate having a third length; and forming a fourth substrate having a fourth length, the fourth length being less than the third length.

Example 15 includes the method of Example 14, further comprising: forming a soldering region on an edge of the third substrate.

Example 16 includes the method of Example 15, further comprising: attaching the first substrate to the second substrate by a first prepreg layer having a length equal to the second length to form a first-layered-stripline board; and attaching the third substrate to the fourth substrate by a second prepreg layer having a length equal to the fourth length to form a second-layered-stripline board.

Example 17 includes the method of Example 16, further comprising; soldering the first-layered-stripline board to the second-layered-stripline board at the soldering region to increase a length of a driving circuit and a power distribution circuit.

Example 18 includes an anti-lightning-stripline-antenna-driving system, comprising: a stripline board including a driving circuit and a power distribution circuit for a linear antenna array; a metal ground bar having a geometry configured to function as one of a microwave frequency ground, a millimeter wave frequency ground, or a radio frequency ground for the driving circuit and the power distribution circuit and to simultaneously function as a lightning ground for the linear antenna array.

Example 19 includes the anti-lightning-stripline-antenna-driving system of Example 18, wherein the stripline board comprises: a first-layered-stripline board including a first substrate having a first length and a second substrate having a second length L, the second length being less than the first length L, wherein a first-driving-circuit portion and a first-distribution-circuit portion of the circuitry are formed at least one of on or in the first substrate, and wherein at least a portion of the first-driving-circuit portion and a portion of the first-distribution-circuit portion are exposed; and a second-layered-stripline board including a third substrate having a third length and a fourth substrate having a fourth length L, the fourth length being less than the third length L, wherein a second-driving-circuit portion and a second-distribution-circuit portion are formed at least one of on or in the third substrate, and wherein at least a portion of the second-driving-circuit portion and a portion of the second-distribution-circuit portion are exposed.

Example 20 includes the anti-lightning-stripline-antenna-driving system of Example 19, further comprising a soldering region on an edge of the third substrate, wherein at least one of: the first-driving-circuit portion is electrically connected to the second-driving-circuit portion via the soldering region; and the first-distribution-circuit portion is electrically connected to the second-distribution-circuit portion via the soldering region.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. An anti-lightning-combined-stripline-circuit system, comprising:
    a stripline board including circuitry; and
    a metal ground bar attached to the stripline board, the metal ground bar having a thickness and a width corresponding to a cross section, wherein the cross section is sufficient for the metal ground bar to function as a ground for the circuitry and simultaneously function as a lightning ground for a linear array of elements driven by the circuitry.

2. The anti-lightning-combined-stripline-circuit system of claim 1, wherein the stripline board comprises:
    a first-layered-stripline board comprising a first substrate having a first length and a second substrate having a second length, the second length being less than the first length, wherein a first-circuit-portion of the circuitry on the first substrate is exposed; and
    a second-layered-stripline board comprising a third substrate having a third length and a fourth substrate having a fourth length, the fourth length being less than the third length, wherein a second-circuit-portion of the circuitry on the third substrate is exposed, the anti-lightning-combined-stripline-circuit system further comprising:
    a soldering region formed by a metal-coated edge-surface of an edge of the third substrate.

3. The anti-lightning-combined-stripline-circuit system of claim 2, further comprising:
    a first prepreg layer having a length equal to the second length, the first prepreg layer attaching the first substrate to the second substrate of the first-layered-stripline board; and
    a second prepreg layer having a length equal to the fourth length, the second prepreg layer attaching the third substrate to the fourth substrate of the second-layered-stripline board.

4. The anti-lightning-combined-stripline-circuit system of claim 2, wherein the first-circuit-portion is electrically connected to the second-circuit-portion by soldering the first-circuit-portion to the second-circuit-portion at the soldering region, wherein at least of a portion of the first-circuit-portion is covered by the third substrate and at least a portion of the second-circuit-portion is covered by the first substrate wherein the length of the stripline board on which the circuitry is positioned is greater than the first length and is greater than the third length.

5. The anti-lightning-combined-stripline-circuit system of claim 2, wherein the soldering region is a metal-coated U-shaped edge surface.

6. The anti-lightning-combined-stripline-circuit system of claim 1, wherein the circuitry comprises:
    a driving circuit for the linear array of elements; and
    a power distribution circuit for the linear array of elements, wherein the stripline board comprises:
    a first-layered-stripline board including a first substrate having a first length and a second substrate having a second length, the second length being less than the first length, wherein at least a portion of a first-driving-circuit portion and a first-distribution-circuit portion on the first substrate is exposed; and
    a second-layered-stripline board including a third substrate having a third length and a fourth substrate having a fourth length, the fourth length being less than the third length, wherein at least a portion of a second-driving-circuit portion and a second-distribution-circuit portion on the third substrate is exposed.

7. The anti-lightning-combined-stripline-circuit system of claim 6, further comprising:
    a soldering region formed from a metal-coated edge-surface of an edge of the third substrate, wherein the soldering region electrically connects the first-driving-circuit portion to the second-driving-circuit portion and the first-distribution-circuit portion to the second-distribution-circuit portion, wherein a length of the linear array of elements driven by the driving circuit is increased.

8. The anti-lightning-combined-stripline-circuit system of claim 1, wherein the circuitry comprises:
    a driving circuit for a linear antenna array; and
    a power distribution circuit for the linear antenna array, wherein the metal ground bar has a geometry configured to function as:
    the lightning ground for the linear antenna array; and
    one of a microwave frequency ground, a millimeter wave frequency ground, or a radio frequency ground for the driving circuit and the power distribution circuit.

9. A method of forming an anti-lightning-combined-stripline-circuit system, the method comprising:
    forming a stripline board having a thickness, a width, and a length, the stripline board including circuitry having a circuitry-length;

forming a metal ground bar; and attaching the stripline board to the metal ground bar having a thickness and a width corresponding to a cross section, wherein the cross section is sufficient for the metal ground bar to function as a ground for the circuitry and simultaneously function as a lightning ground for a linear array of elements driven by the circuitry.

10. The method of claim 9, wherein forming a stripline board including circuitry comprises:

forming a first-circuit-portion of the circuitry at least one of in or on a first substrate having a first length;

forming a second substrate having a second length, the second length being less than the first length;

forming a second-circuit-portion of the circuitry at least one of in or on a third substrate having a third length; and forming a fourth substrate having a fourth length, the fourth length being less than the third length.

11. The method of claim 10, further comprising:

forming a soldering region on an edge of the third substrate.

12. The method of claim 11, further comprising:

attaching the first substrate to the second substrate by a first prepreg layer having a length equal to the second length to form a first-layered-stripline board; and attaching the third substrate to the fourth substrate by a second prepreg layer having a length equal to the fourth length to form a second-layered-stripline board.

13. The method of claim 12, further comprising soldering the first-layered-stripline board to the second-layered-stripline board at the soldering region, wherein the circuitry-length of the circuitry is greater than the first length and is greater than the third length.

14. The method of claim 9, wherein forming a stripline board including circuitry comprises:

forming a first-driving-circuit portion and a first-distribution-circuit portion of the circuitry at least one of in or on a first substrate having a first length;

forming a second substrate having a second length, the second length being less than the first length;

forming a second-driving-circuit portion and a second-distribution-circuit portion at least one of in or on a third substrate having a third length; and forming a fourth substrate having a fourth length, the fourth length being less than the third length.

15. The method of claim 14, further comprising:

forming a soldering region on an edge of the third substrate.

16. The method of claim 15, further comprising:

attaching the first substrate to the second substrate by a first prepreg layer having a length equal to the second length to form a first-layered-stripline board; and attaching the third substrate to the fourth substrate by a second prepreg layer having a length equal to the fourth length to form a second-layered-stripline board.

17. The method of claim 16, further comprising;

soldering the first-layered-stripline board to the second-layered-stripline board at the soldering region, wherein a length of a driving circuit and a length of a power distribution circuit are greater than the first length and are greater than the third length.

18. An anti-lightning-stripline-antenna-driving system, comprising:

a stripline board including a driving circuit and a power distribution circuit for a linear antenna array; and a metal ground bar having a thickness and a width corresponding to a cross section, wherein the cross section is sufficient for the metal ground bar to function as one of a microwave frequency ground, a millimeter wave frequency ground, or a radio frequency ground for the driving circuit and the power distribution circuit and simultaneously function as a lightning ground for the linear antenna array.

19. The anti-lightning-stripline-antenna-driving system of claim 18, wherein the stripline board comprises:

a first-layered-stripline board including a first substrate having a first length and a second substrate having a second length, the second length being less than the first length, wherein a first-driving-circuit portion and a first-distribution-circuit portion of the circuitry are formed at least one of on or in the first substrate, and wherein at least a portion of the first-driving-circuit portion and a portion of the first-distribution-circuit portion are exposed; and a second-layered-stripline board including a third substrate having a third length and a fourth substrate having a fourth length, the fourth length being less than the third length, wherein a second-driving-circuit portion and a second-distribution-circuit portion are formed at least one of on or in the third substrate, and wherein at least a portion of the second-driving-circuit portion and a portion of the second-distribution-circuit portion are exposed.

20. The anti-lightning-stripline-antenna-driving system of claim 19, further comprising a soldering region on an edge of the third substrate, wherein at least one of:

the first-driving-circuit portion is electrically connected to the second-driving-circuit portion via the soldering region; and the first-distribution-circuit portion is electrically connected to the second-distribution-circuit portion via the soldering region.

* * * * *